(12) United States Patent
Fontana

(10) Patent No.: US 9,824,956 B2
(45) Date of Patent: Nov. 21, 2017

(54) SURFACE-MOUNT SEMICONDUCTOR DEVICE HAVING EXPOSED SOLDER MATERIAL

(71) Applicant: STMicroelectronics S.R.L., Agrate Brianza (IT)

(72) Inventor: Fulvio Vittorio Fontana, Monza (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days.

(21) Appl. No.: 14/971,750

(22) Filed: Dec. 16, 2015

(65) Prior Publication Data

US 2016/0351476 A1    Dec. 1, 2016

(30) Foreign Application Priority Data

May 28, 2015  (IT) .......................... 102015000018951

(51) Int. Cl.

| H01L 23/495 | (2006.01) |
| H01L 21/00 | (2006.01) |
| H05K 5/02 | (2006.01) |
| H01L 23/00 | (2006.01) |
| H01L 21/56 | (2006.01) |
| H01L 23/31 | (2006.01) |
| H01L 21/60 | (2006.01) |

(52) U.S. Cl.
CPC ...... *H01L 23/49503* (2013.01); *H01L 21/561* (2013.01); *H01L 23/3114* (2013.01); *H01L 23/4952* (2013.01); *H01L 24/97* (2013.01); H01L 2021/6027 (2013.01); H01L 2224/32245 (2013.01); H01L 2224/48247 (2013.01); H01L 2224/73265 (2013.01); H01L 2924/181 (2013.01)

(58) Field of Classification Search
CPC ............... H01L 23/49503; H01L 21/78; H01L 23/49537; H01L 23/49551; H01L 24/83; H01L 24/97; H01L 23/3107; H01L 23/4952; H01L 23/3114
See application file for complete search history.

(56) References Cited

U.S. PATENT DOCUMENTS

| 6,872,599 B1 | 3/2005 | Li et al. | |
| 8,501,539 B2 * | 8/2013 | Hess | H01L 21/4842 257/666 |
| 8,994,160 B2 * | 3/2015 | Kimura | H01L 23/49541 257/666 |
| 9,385,057 B2 * | 7/2016 | Yoshino | H01L 23/49541 |
| 2002/0084518 A1 * | 7/2002 | Hasebe | H01L 23/3107 257/676 |
| 2005/0116321 A1 | 6/2005 | Li et al. | |
| 2007/0176267 A1 | 8/2007 | Abbott | |

(Continued)

*Primary Examiner* — Alonzo Chambliss
(74) *Attorney, Agent, or Firm* — Seed IP Law Group LLP

(57) ABSTRACT

A process for manufacturing surface-mount semiconductor devices, in particular of the Quad-Flat No-Leads Multi-Row type, comprising providing a metal leadframe, in particular a copper leadframe, which includes a plurality of pads, each of which is designed to receive the body of the device, the pads being separated from adjacent pads by one or more rows of wire-bonding contacting areas, outermost rows from among the one or more rows of wire-bonding contacting areas identifying, together with outermost rows corresponding to the adjacent pads, separation regions.

20 Claims, 15 Drawing Sheets

(56) References Cited

U.S. PATENT DOCUMENTS

| | | | |
|---|---|---|---|
| 2008/0142936 A1* | 6/2008 | Yilmaz | H01L 21/4828 257/673 |
| 2010/0015329 A1 | 1/2010 | Nguyen et al. | |
| 2010/0258921 A1* | 10/2010 | Chang Chien | H01L 21/4832 257/676 |
| 2011/0079888 A1* | 4/2011 | Bathan | H01L 21/4832 257/676 |
| 2012/0241922 A1 | 9/2012 | Pagaila | |
| 2014/0225239 A1* | 8/2014 | Kimura | H01L 21/78 257/666 |
| 2015/0014829 A1 | 1/2015 | Abbott | |
| 2015/0076690 A1 | 3/2015 | Yoshino | |

* cited by examiner

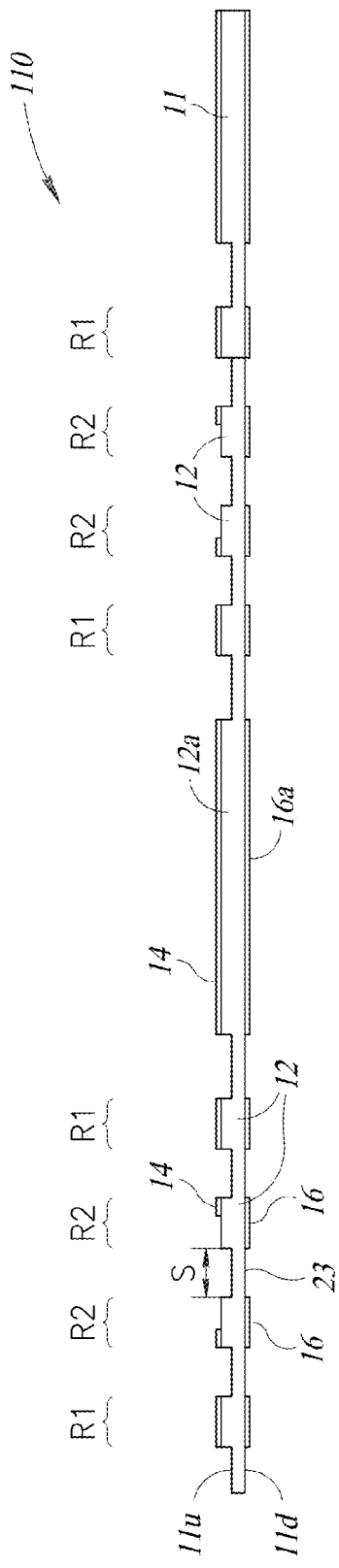
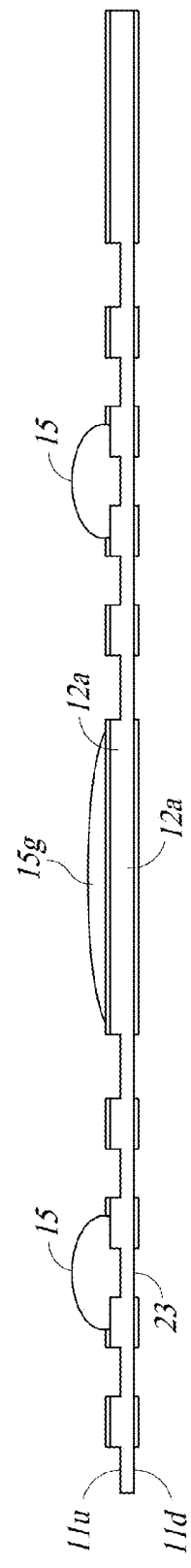
FIG.1A
FIG.1B

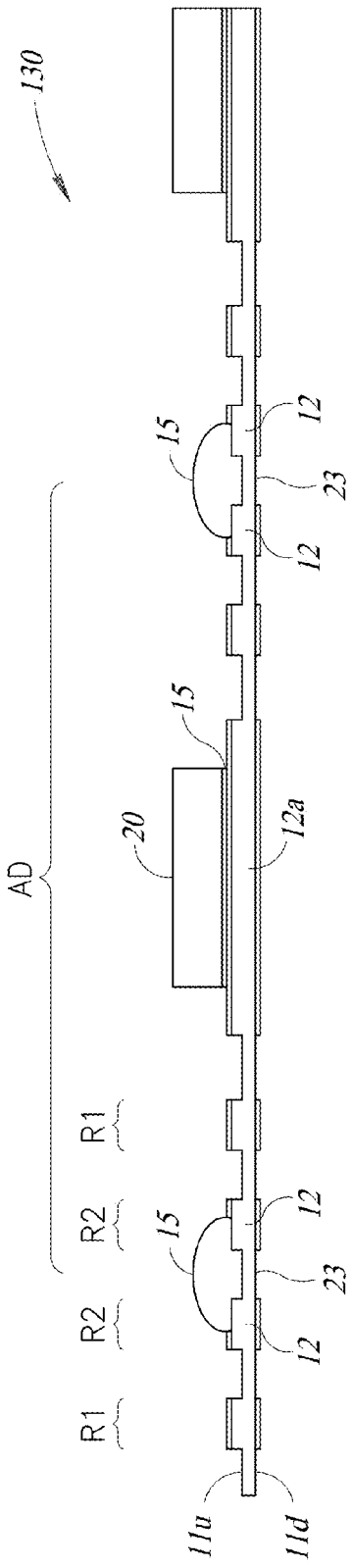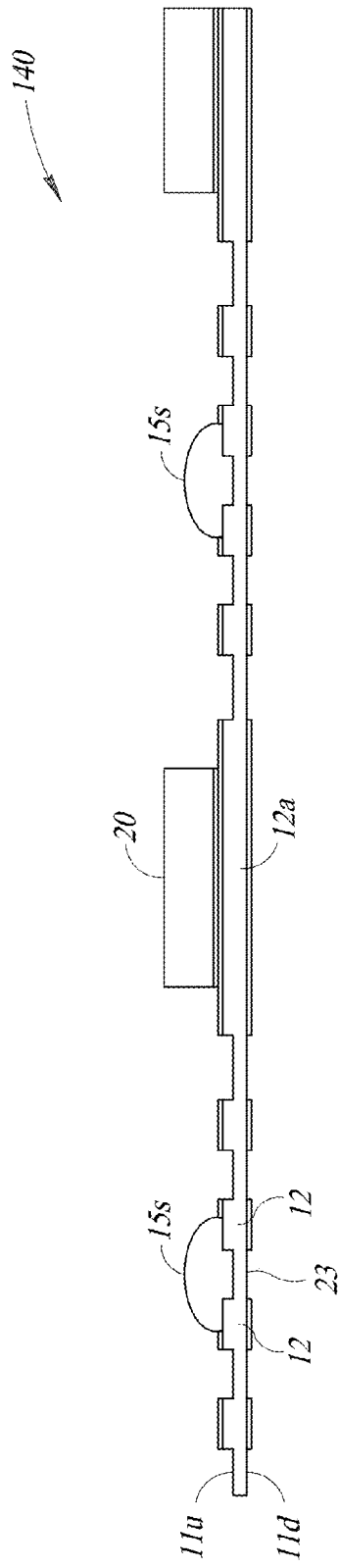

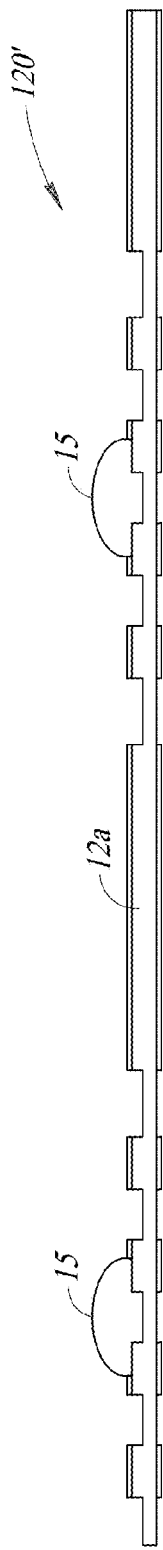
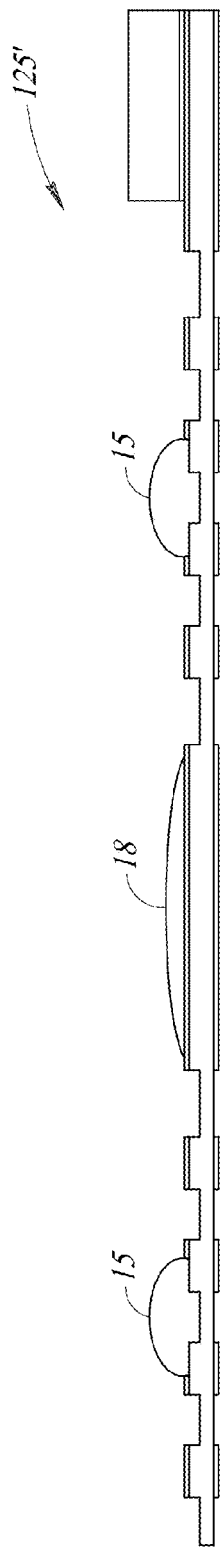
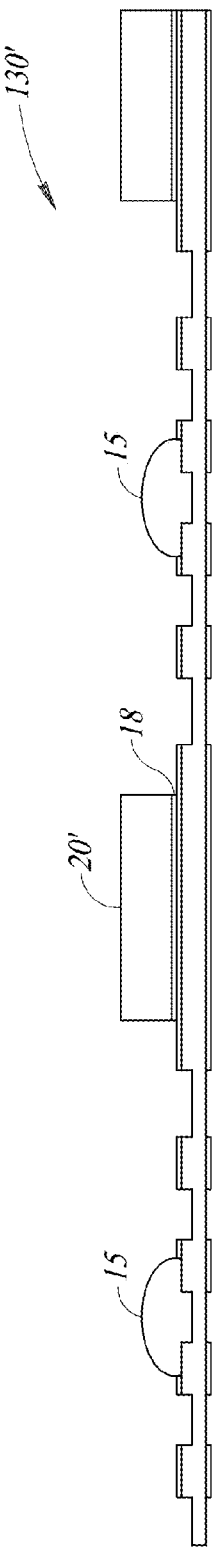
FIG.2A
FIG.2B
FIG.2C

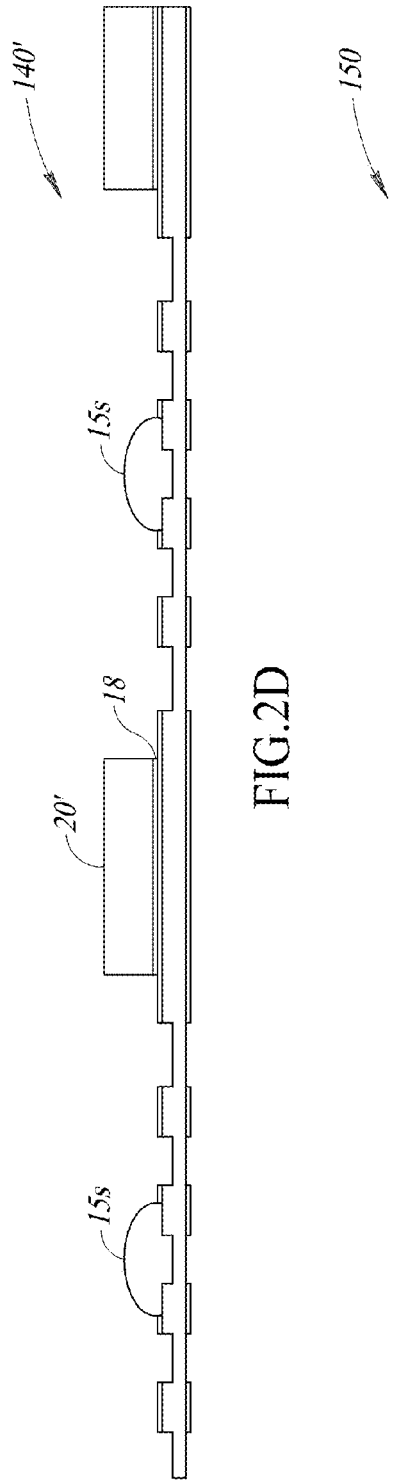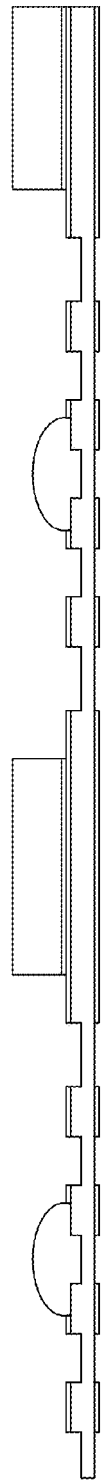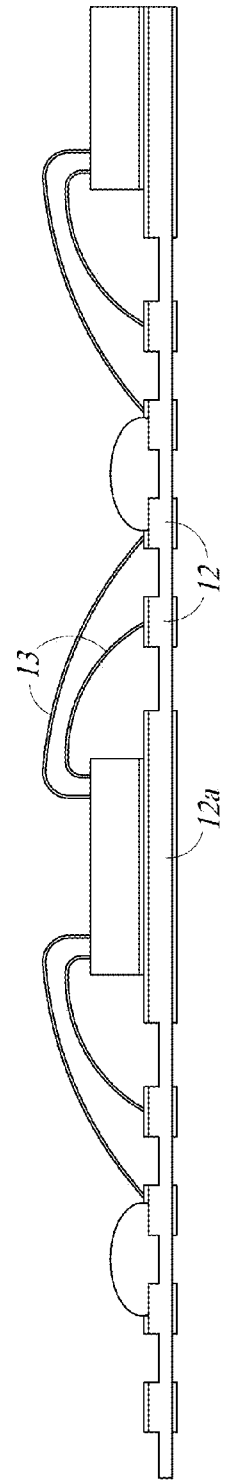

SURFACE-MOUNT SEMICONDUCTOR DEVICE HAVING EXPOSED SOLDER MATERIAL

BACKGROUND

Technical Field

Described herein is a process for manufacturing semiconductor devices of a surface-mount type, in particular of the Quad-Flat No-Leads Multi-Row (QFN_mr) type, comprising providing a metal leadframe, in particular a copper leadframe, which includes a plurality of pads, each of which is designed to receive the body of the device, said pads being separated from adjacent pads by one or more rows of wire-bonding contacting areas, the outermost rows from among said one or more rows of wire-bonding contacting areas identifying, together with outermost rows corresponding to the adjacent pads, separation regions.

Various embodiments may be applied to QFN_mr devices for applications of power control, radiofrequency transmissions, digital conversion of physical/electrical inputs in the consumer, automotive, and industrial sectors.

Description of the Related Art

As is known, semiconductor devices, such as, for example, integrated circuits and MEMS devices, are encapsulated within corresponding packages, which perform functions of protection from and interfacing with the outside world. For instance, so-called "surface-mount" packages are known, which enable surface mounting on a printed circuit board (PCB).

In greater detail, surface-mount packages comprise, for example, the so-called packages of a "No-Lead Quad-Flat" (QFN) type, known also as "Micro-Leadframe" (MLF) packages or "Small-Outline No-leads" (SON) packages.

In general, with reference, for example, to a package of a QFN type, it comprises a resin region, encapsulated in which is a leadframe, which in turn forms at least one array of terminals that give out onto a bottom surface of the package. An example of process for producing a package comprising a leadframe is described in U.S. Patent Pub. No. US 2005/0116321.

As compared to a standard QFN device, the QFN_mr device starts from a pitch of 0.4 mm and, given the same area, has a higher number of inputs/outputs, these possibly being arranged on the bottom surface of the QFN_mr device starting from the central area occupied by the dissipater of the device, as far as its edge, whereas in the standard QFN device the inputs/outputs may be arranged only along the edges.

In standard QFN devices, the surface of the outer contacts reaches the edge of the device since there do not exist problems of detachment of the contacts themselves during singulation of the devices in so far as the contacts are supported by the structure of the leadframe. In QFN_mr devices, the contacts, before the operation of singulation is carried out, are completely insulated and supported merely by the packaging resin and by the wires; consequently, they are unable to withstand the stress transmitted by the cutting blade without delaminating. For this purpose, the leadframe of QFN_mr devices is designed so as to leave a space between the contacts and the edge of the packaging, typically of 0.1 mm.

In some circumstances, for example in the automotive sector, in order to provide the qualitative levels of the operation of soldering of QFN_mr devices on the PCB, it is a specification for the outer contacts (namely, the ones subjected to most stress from the thermo-mechanical standpoint considering the distance from the neutral point of the soldered device corresponding to the center of the device itself) to be visually inspectable in order to check that the dimensions and shape of the soldered bead respect the minimum specifications.

As regards to standard QFN devices, this specification is met by introducing a process of plating or else deposition of tin on the exposed side of the contact so as to obtain a surface set at 90° with respect to the soldering pad on the PCB, a surface that enables a soldering meniscus to be obtained that is stronger and more easily inspectable via automatic inspection.

As regards QFN_mr devices, this is not possible since the contact does not extend to the edge of the packaging.

BRIEF SUMMARY

One or more embodiments are directed to semiconductor devices and a process of forming same.

Various embodiments of a process may envisage:
depositing in the separation regions conductive soldering material so as to join wire-bonding contacting areas corresponding to adjacent pads;
fixing the devices to the respective pads; and
carrying out a thermal process on the leadframe that is designed to sinter or re-flow the conductive soldering material.

Various embodiments may moreover envisage:
carrying out a wire bonding, which comprises associating wires between the wire-bonding contacting areas joined by the conductive soldering material and the respective pads;
carrying out a molding of a package on the leadframe; and
carrying out a singulation of devices by making cuts along the aforesaid separation regions so as to cut the conductive soldering material leaving surfaces of the bead of conductive soldering material exposed outwards of the device.

Various embodiments may envisage that the aforesaid conductive soldering material is TLPS (Transient Liquid Phase Solder).

Various embodiments may envisage provision of a metal leadframe, in particular a copper leadframe, comprising a plurality of previously plated pads and wire-bonding contacting areas.

Various embodiments may envisage that the areas of the outermost rows are partially plated, leaving a portion of the area that faces the separation region exposed.

Various embodiments may envisage provision of a leadframe with separation regions of at least 600 µm in width.

Various embodiments may envisage, following upon the aforesaid singulation operation, mounting the singulated device on a PCB via the steps of laying out solder-paste beads on the PCB and resting on the solder-paste beads an edge formed by the lateral and bottom surfaces of the cut soldered beads, thus bringing about formation of a lateral meniscus of the solder-paste bead.

Various embodiments may refer to a semiconductor device of a surface-mount type, in particular of the Quad-Flat No-Leads Multi-Row (QFN_mr) type, comprising a body of semiconductor material and a leadframe element that includes a plurality of contact terminals electrically connected to the semiconductor body, the aforesaid leadframe element comprising a pad, which receives the semiconductor body, and one or more rows of wire-bonding contacting areas, the contact terminals being electrically connected to the wire-bonding contacting areas.

Various embodiments may envisage that the contact terminals are sintered.

Various embodiments may envisage that the device comprises a package, which includes a dielectric layer that coats a device area, comprising the aforesaid semiconductor body, the aforesaid pad, and the aforesaid one or more rows of wire-bonding contacting areas, the package being delimited underneath by the aforesaid leadframe element, the aforesaid contact terminals giving out onto a bottom surface of the package and onto a lateral surface of the package.

BRIEF DESCRIPTION OF THE SEVERAL VIEWS OF THE DRAWINGS

Various embodiments will now be described, purely by way of example, with reference to the annexed drawings, wherein:

FIGS. 1A, 1B, 1C, and 1D are cross-sectional views representing steps of the process described herein;

FIGS. 2A, 2B, 2C, and 2D are cross-sectional views representing a variant embodiment of the process described herein;

FIGS. 3A, 3B, and 3C are cross-sectional views representing further steps of the process described herein;

DETAILED DESCRIPTION

Figure 3C:
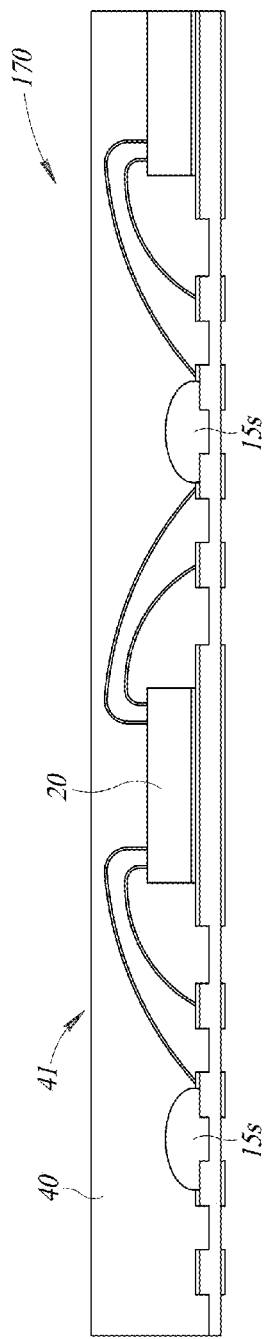

In the ensuing description, numerous specific details are provided aimed at enabling maximum understanding of the embodiments provided by way of example. The embodiments may be implemented with or without specific details, or else with other processes, components, materials, etc. In other circumstances, well-known structures, materials, or operations are not illustrated or described in detail so that aspects of the embodiments will not be obscured. Reference, in the course of this description, to "an embodiment" or "one embodiment" is meant to indicate that a particular feature, structure, or characteristic described in connection with the embodiment is comprised in at least one embodiment. Hence, phrases such as "in an embodiment" or "in one embodiment" or the like that may be present in various points of the present description do not necessarily refer to one and the same embodiment. Furthermore, the particular features, structures, or characteristics may be combined in any convenient way in one or more embodiments.

The references are provided herein merely for convenience of the reader and do not define the scope or the meaning of the embodiments.

FIG. 1A, which represents a first step 110 of the process described herein, shows a lateral cross-sectional view of a standard leadframe. The first step 110 envisages starting from a standard metal leadframe 11, specifically a copper leadframe, in particular of a PPF (Pre-Plated Frame) type. The leadframe 11 is substantially a copper plate on which, in particular by etching, reliefs or recesses are obtained with respect to a base plane of the top surface 11$u$. These reliefs form pads 12$a$, which have a wide surface designed to receive the body of a semiconductor device 20, also referred to as a die. There is a plurality of pads 12$a$, which are generally arranged in rows and columns on the leadframe 11 (see, in this regard, the perspective view of FIG. 8A) and are separated from adjacent pads by one or more rows, in this embodiment two rows R1, R2, of smaller contacting areas 12 or leads that are connected by joining portions, where bonding wires 13 are to be applied. The outermost rows, in this case the rows R2 of areas 12 corresponding to a pad 12$a$, identify, together with the outermost rows corresponding to the adjacent pads, separation regions 23. Pads 12$a$ are placed in a central position with respect to the smaller areas 12 where the bonding wires 13 are to be applied, as well as for adhering of the device 20 on their top surface 11$u$.

The pads 12$a$ and the areas 12 are plated with contact layers 14 using materials such as NiPd or else NiPdAu or else Ag in order to define the areas where the bonding wires 13 are to be applied. The contact layers 14 are preferably plated before providing the leadframe 11, according to the known PPF technique (leadframe pre-plated with an electrochemical process).

As has been mentioned, each pad 12$a$ is separated from another by four areas 12. As may be noted more clearly from FIG. 8, this corresponds to the fact that each pad 12$a$ is surrounded by a first row R1 of areas 12 and by a second row R2 of areas 12, which, as is more clearly visible in FIG. 8, are arranged according to a rectangular perimeter around the pad 12$a$. Identified between the second rows R2 corresponding to adjacent pads are separation regions 23, which, in the process described herein, have a width S of at least 600±50 µm.

On a bottom surface 11$d$ of the leadframe 11 there are obtained, once again by plating, solderable bottom contacts 16, in the position corresponding to the areas 12, and in a position corresponding to the top pad 12$a$ a bottom pad 16$a$ is provided, the bottom contacts 16 and the bottom pad 16$a$ being plated directly on the bottom copper surface 11$d$ of the leadframe 11, which is substantially planar and without any reliefs.

Figure 8A:
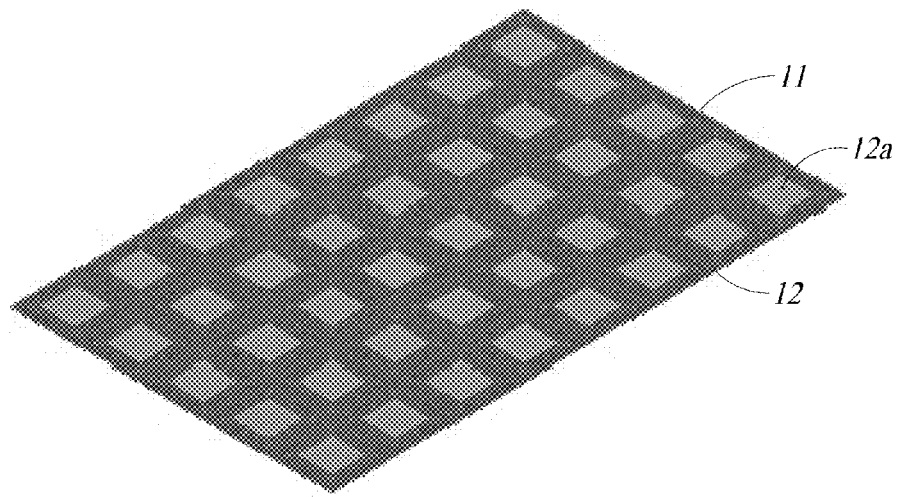
FIGS. 8A and 8B show a perspective view and an enlarged perspective view of a plurality of devices in a first step of the manufacturing process described herein.
Figure 8B:
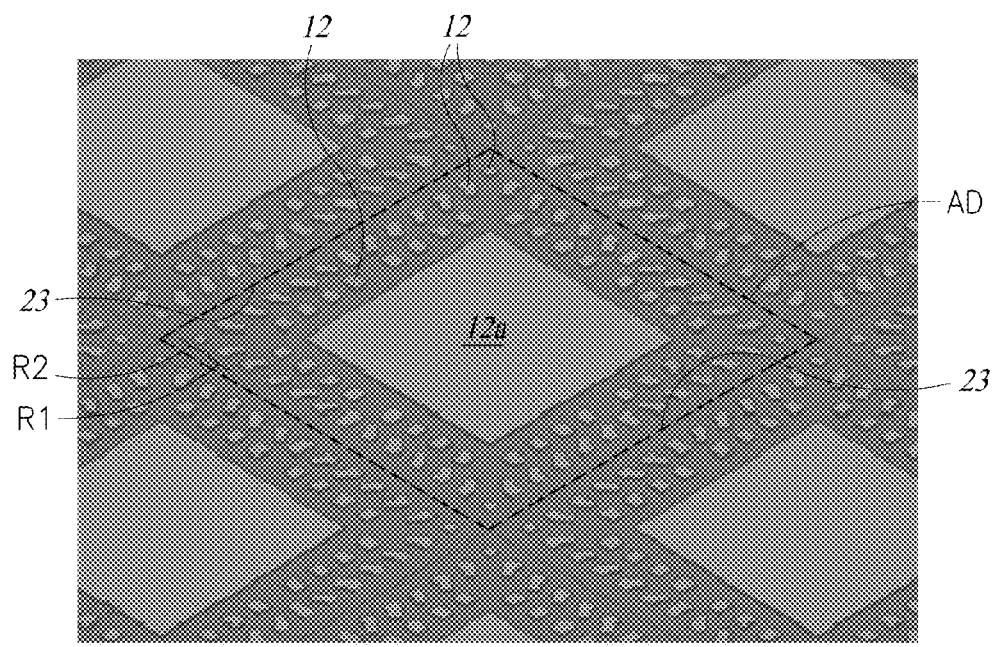

Illustrated in FIG. 8A is a corresponding perspective view of the leadframe 11 of a QFN_mr type in step 100, visible on the top surface 11$u$ of which are the pads 12$a$ having a substantially rectangular shape. As may be appreciated more clearly from FIG. 8B, which shows an enlargement of a pad 12a, these pads 12a are surrounded by the first row R1 of areas 12, which are to undergo wire bonding, along a rectangular perimeter around the pad 12a. Arranged on the outside of this perimeter is the second row R2 of areas 12, and then the contact region 23. As may be noted from FIG. 8B, the areas 12 of the second rows R2 are partially plated, leaving a portion of the area 12, which faces the separation region 23, exposed.

Basically, a device area AD may be identified that ranges from one half of the length S of the separation regions 23 and includes inside it the rows R2 and R1 and the pad 12a. As illustrated in FIG. 8A, the aforesaid area AD of the device is also substantially rectangular, and its perimeter runs along the longitudinal axis of channels identified by the separation regions 23. Along this perimeter, as illustrated in what follows, the cuts for the operations of singulation of the device are then made.

Figure 9:
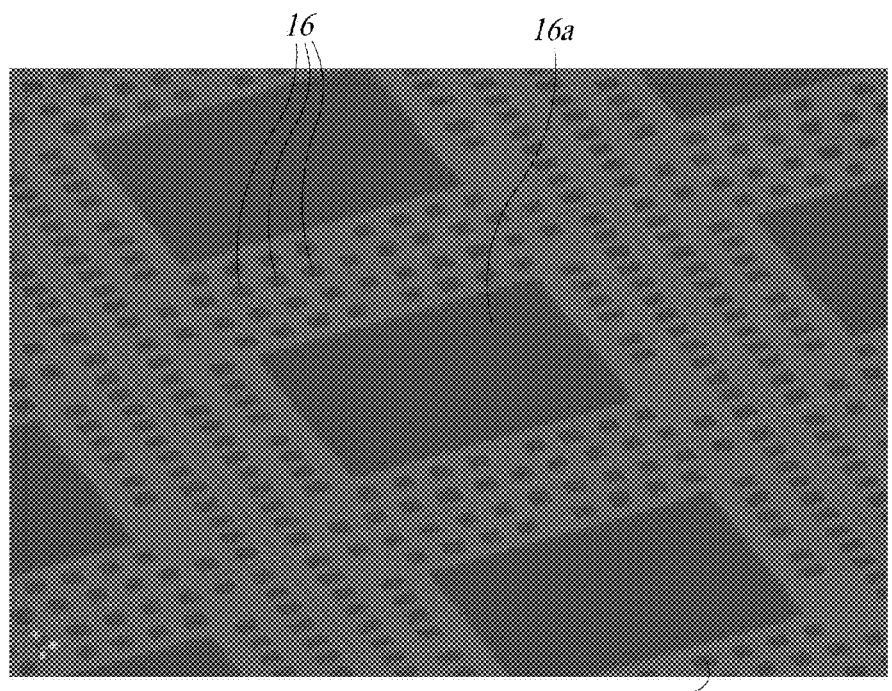
FIG. 9 shows a further view of the plurality of devices in a first step of the manufacturing process described herein.

FIG. 9 is a perspective view of the bottom surface 11d, once again substantially in a processing step corresponding to step 100, visible in which is the arrangement of the corresponding contacts 16 and the bottom pads 16a, which corresponds to that of the areas 12 and the pads 12a on the top surface 11d and hence comprises the bottom pads 16a surrounded by two rows of bottom contacts 16 arranged along rectangular perimeters.

To return to the process illustrated in FIG. 1, in order to provide contact terminals 50 (visible, for example, in FIG. 7) in a step 120, illustrated in FIG. 1B, in the above region 23 conductive soldering material 15 is applied, in particular a bead of conductive soldering material 15. The term "bead" is here understood in the sense of a bead of soldering material with application of filler material, i.e., an amount of conductive material that, once sintered or re-flowed via thermal process, provides a mechanical and electrical contact between the surfaces 23 and 12 made of copper with formation of an inter-metal layer. The bead of conductive soldering material 15 preferably comprises material sinterable at low temperature (220° C.) and irreversible of the TLPS (Transient Liquid-Phase Solder) type, in particular a copper and tin composite, for example the material DAP689 produced by ORMET. The TLPS material is substantially a material with a copper and tin base sinterable at low temperature (less than 250° C.), which once sintered is stable and forms, following upon sintering, an inter-metal resistant to the process of etching of the copper leadframe.

In variant embodiments, the conductive soldering material 15 may be a conductive alloy with a reflow-soldering temperature higher than 260° C., and hence higher than that of SAC (tin-silver-copper) alloys used for soldering devices on PCBs, which is also resistant to the process of etching of the copper leadframe. For instance, a silver-bismuth alloy, for example the material BiAgX produced by Indium, is here used, or else a solder paste at a reflow-soldering temperature higher than 260° C.

Application, in step 120, of the conductive soldering material 15 is performed using a dispensing needle, which is moved from one contact to another to form the bead, or else by hot rolling plus application of pressure, or else by transfer with silk-screen printing technique. The TLPS material may preferably be applied by needle dispensing or with silk-screen printing techniques, whereas the paste with conductive alloy may preferably be applied just with silk-screen printing technique.

The conductive soldering material 15 is applied in such a way as to cover also approximately 50% of the contiguous surface on the wire-bonding area 12, i.e., substantially the surface left without plating 14, for a length of not less than 100±50 µm. There is thus created a bead of conductive material 15, of oblong shape, the total length S of which, in the direction that joins two areas 12 corresponding to two adjacent pads, is greater than 800±50 µm, the width is 250±50 µm, and the thickness is greater than 200±50 µm.

The part of the area 12 that is to receive the bonding wire 13 is plated in order to create a discontinuity with respect to the contiguous surface of the area 12 itself on which the conductive material 15 is applied, this surface being, instead, left exposed, and hence being a copper surface. In this way, the degree of overstepping of the margins by the conductive material 15 is controlled, thus preventing the material from contaminating the portion of the area 12 provided with the plating 14, where the bonding wires 13 are effectively to be applied.

Where it is desired to use rough copper as surface finishing of the part of the area 12 designed for wire bonding, the contiguous surface is once again made of copper, but with a standard roughness.

Figure 10A:
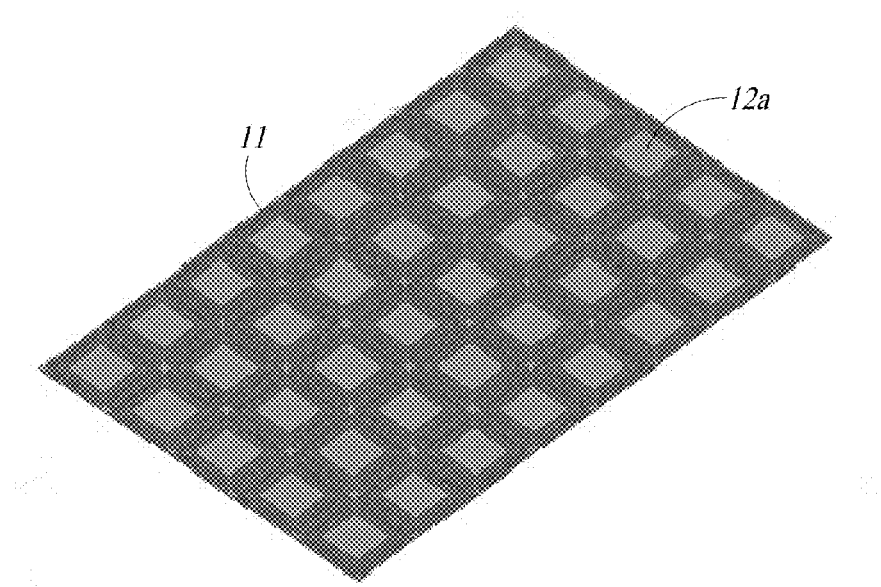
FIGS. 10A and 10B show a perspective view and an enlarged perspective view of a plurality of devices in a second step of the manufacturing process described herein.
Figure 10B:
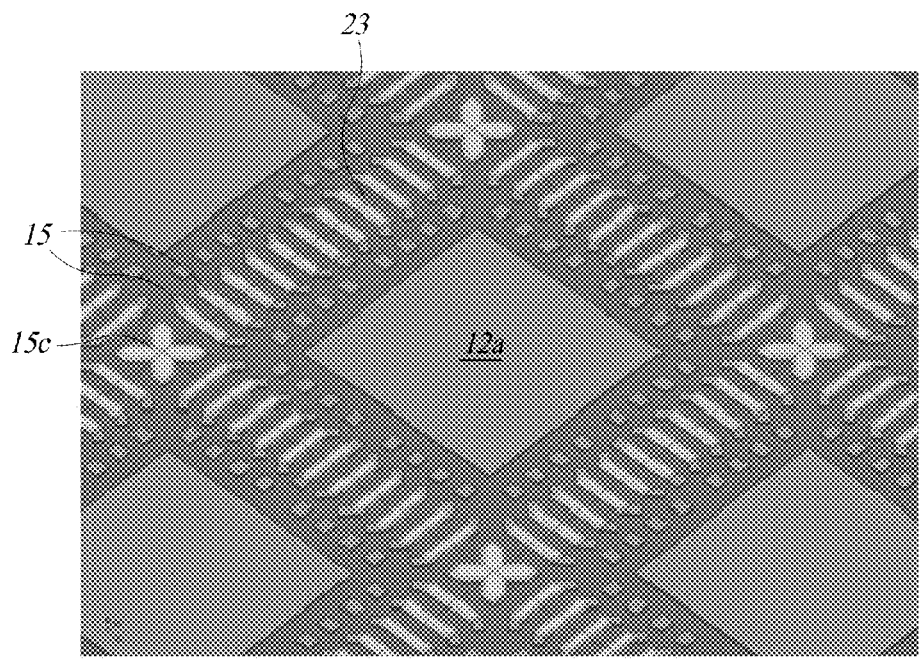

FIGS. 10A and 10B are perspective views of the leadframe 11, similar to the views 8A and 8B, after execution of the step 120, where there may be noted the beads made of conductive material 15, each of which extends between two areas 12 of the second rows R2, thus joining them. Also visible in FIG. 10B are corner contacts 15c that are formed by depositing material 15 on non-plated areas 12.

Figure 11:
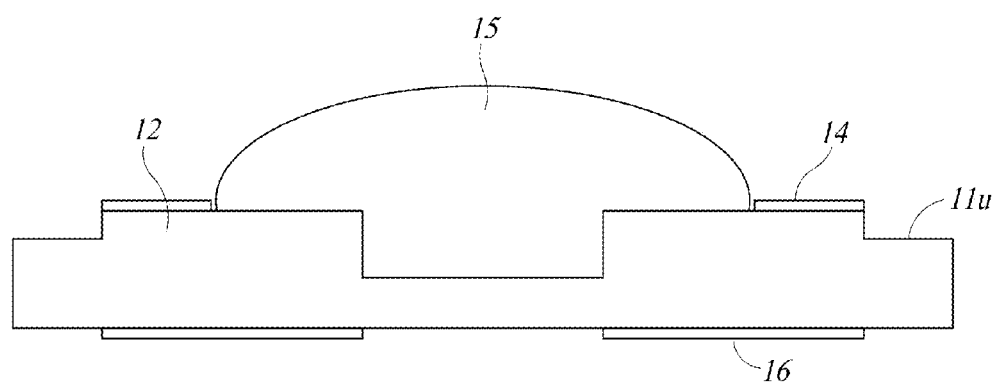
FIGS. 11, 13, 15, 17, and 19 show a detail of the device in different steps of the manufacturing process.

FIG. 11 is, instead, an enlargement of a section of the cross-sectional view of FIG. 1B regarding the contact 15 made of conductive material.

With reference to FIG. 1C, step 130 is then a step of mounting of the body of the semiconductor device 20, also referred to as a die. In the case where a device 20 with a metallized bottom surface is to be mounted (as in step 130), the conductive material 15 can be deposited in a layer 15g also on the pad 12a to enable adhering of the device 20, and in this way can be applied simultaneously with application of the lateral contacts.

The conductive material 15 is then sintered in a step 140 (illustrated in FIG. 1D) if it is a sinterable material, or else alternatively subjected to reflow, via passage through a tunnel oven or else in a static oven. For sintering, the maximum temperature is 220° C., whereas, for reflow of the paste with high reflow-soldering temperature, temperatures of between 270° C. and 300° C. are used.

The oxygen content of the oven is monitored in order to provide complete sintering or reflow. This condition is obtained by getting the ovens to work in a nitrogen atmosphere. In the embodiment of a low-temperature sinterable material (TLPS), it is possible to improve sintering further by getting the oven to work in a reducing atmosphere. This condition is obtained by getting the ovens to work with a mixture of nitrogen $N_2$ and hydrogen $H_2$ (with a percentage of $H_2$ of less than 5%). As illustrated in FIG. 1D, the beads of conductive soldering material 15 undergo sintering or else reflow (in the embodiment of a paste with high reflow-soldering temperature), becoming soldered beads 15s, connected by soldering to the respective wire-bonding areas 12.

Figure 12:
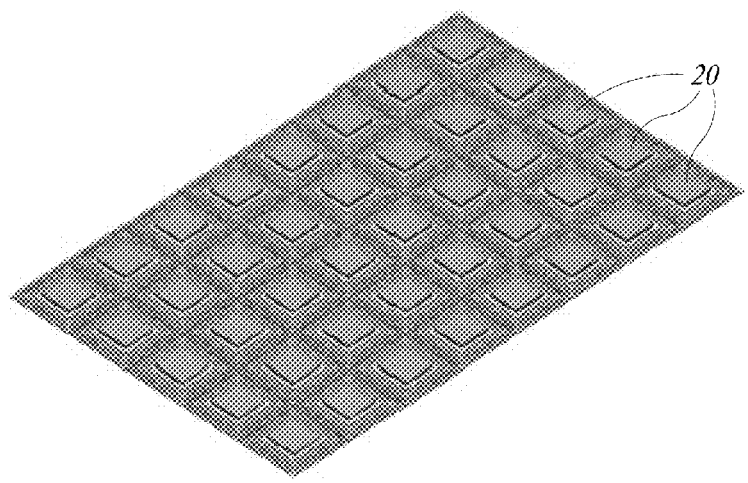
FIG. 12 shows a perspective view of a plurality of devices in a third step of the manufacturing process described herein.

FIG. 12 presents a perspective view of the leadframe 11 (after step 130) bearing the dice 20, adhering to the pads 12a, and the soldered beads 15s.

FIGS. 2A-2D illustrate the same process steps as those of FIG. 1, but regarding an embodiment where it is desired to mount a device 20', with the bottom surface made of silicon oxide. In this embodiment, after the step 110 of providing the leadframe 11, a step 120' of deposition of the conductive material 15 is carried out, where there is not deposited also the layer 15g on the pad 12a but, in a step 125', an adhesion material 18 is applied thereon, which is of a standard type for devices 20' with a bottom surface made of silicon oxide, namely, for example C-DAF (Conductive Die-Attach Film) or else glues are used, following application of the conductive soldering material 15. In a step 130', the device 20' with the bottom surface made of silicon oxide is applied on the pad 16a. Polymerization of the layer of adhesion material 18 into a polymerized layer 18s is performed during the step 140' of sintering or reflow of the conductive soldering material 15.

FIGS. 3A-3C illustrate the steps subsequent to the step of thermal treatment, in particular sintering, 140 or 140'. The first next step is a step 150 of plasma cleaning, the purpose of which is to remove any organic contamination from the areas 12 where wire-bonding is to be carried out. It is to be borne in mind that, if a material containing tin is used as conductive material 15 for providing the contacts, this material reacts with the hydrogen that is possibly used in plasma cleaning (i.e., the forming gas) to form unstable compounds that lead to contamination of the plasma itself. It is thus preferable to carry out the step of plasma cleaning 150 using as reactive gas nitrogen in association with argon, which provides proper mechanical cleaning.

A step 160 of wire bonding is then carried out, which is made using gold, copper, or silver wire 13 on the plated surfaces 14 (or else on the rough copper surfaces) of the areas 12 and pads 12a. Wires 13 are connected between each area 12 of the rows R1 and R2 and the pad 12a that the areas 12 enclose in their perimeter.

Figure 13:
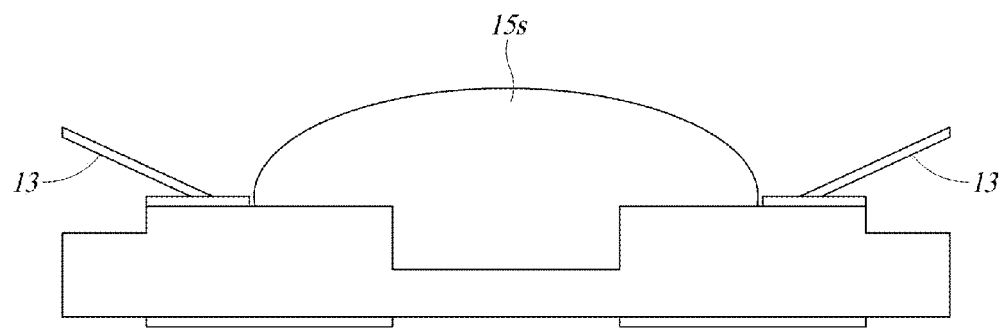

FIG. 13 represents a detail of the soldered bead 15s after wire bonding 160, where the wire 13 is set in contact with the plated surface 14.

Figure 14:
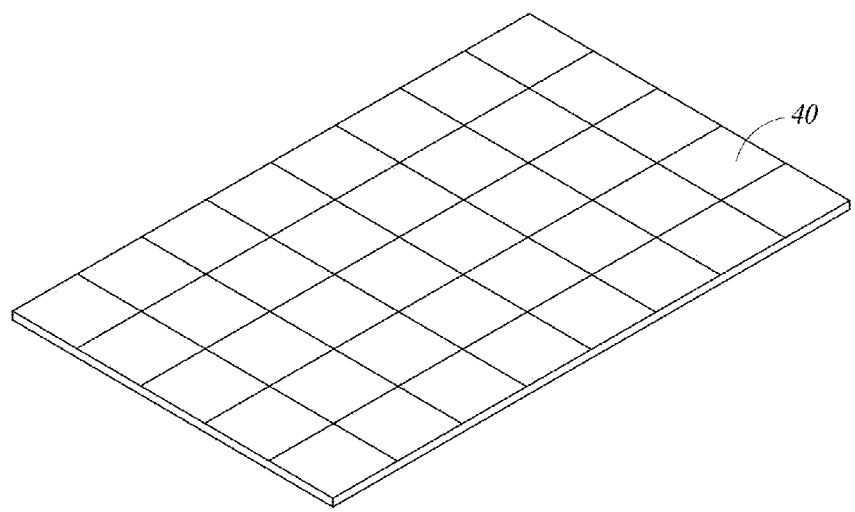
FIG. 14 shows a perspective view of a plurality of devices in a fourth step of the manufacturing process described herein.
Figure 15:
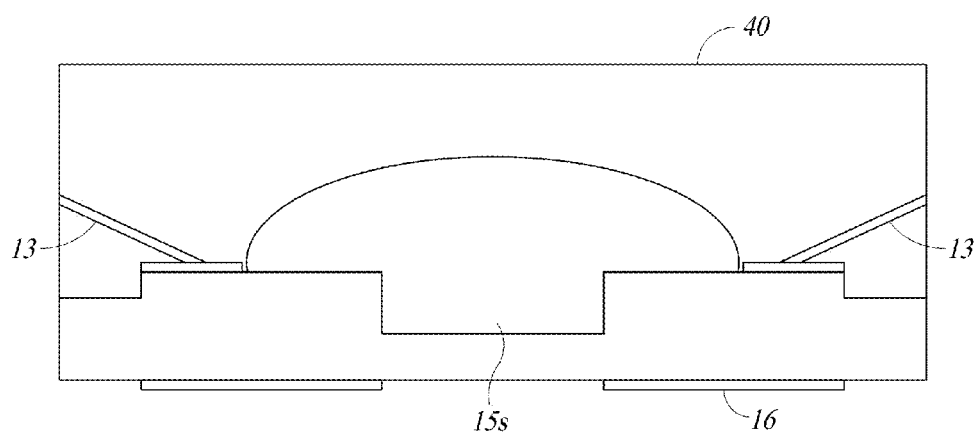

The next step 170 (illustrated in FIG. 3C) is a step of molding of a layer 40 of dielectric material, in particular plastic resin, on the leadframe 11 to obtain a package 41 made of resin that protects the wires 13 and the device 20 or 20'. FIG. 14 is a schematic view of the leadframe 11 coated with a dielectric layer 40, whereas FIG. 15 shows a detail of the soldered bead 15s after coating with the dielectric layer 40. In greater detail, the molding step 170 envisages forming a dielectric layer 40 via injection of a thermosetting epoxy resin, in which silicon micro-particles are dispersed. The dielectric layer 40 is formed on the die of the body of the semiconductor device 20 and coats the entire area AD of the device, and hence also the soldered bead 15s. Of course, the dielectric layer 40, namely the resin layer, also covers the other areas of the device on the leadframe 11.

The molding step 170 may be followed by a thermal treatment, for example, at the curing temperature of 175° C., this treatment being known as post-molding curing (PMC).

Figure 4:
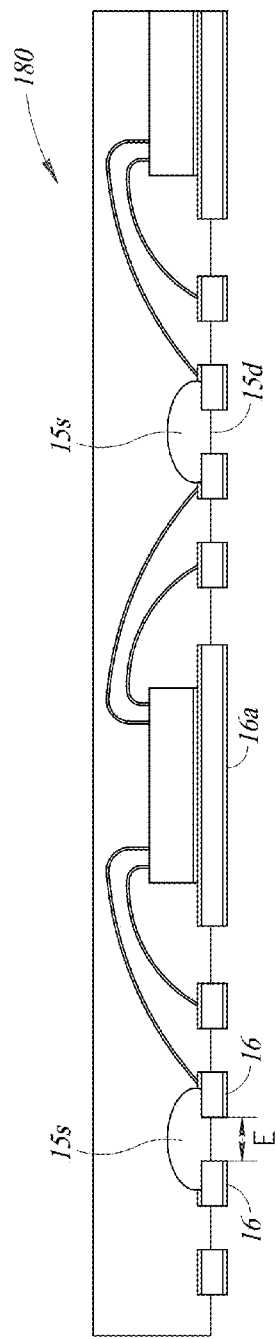
FIG. 4 shows a cross-sectional view of a further step of the process described herein.

FIG. 4 illustrates, once again in lateral cross-sectional view, the leadframe 11 in a further step 180 of the process described herein.

Figure 16A:
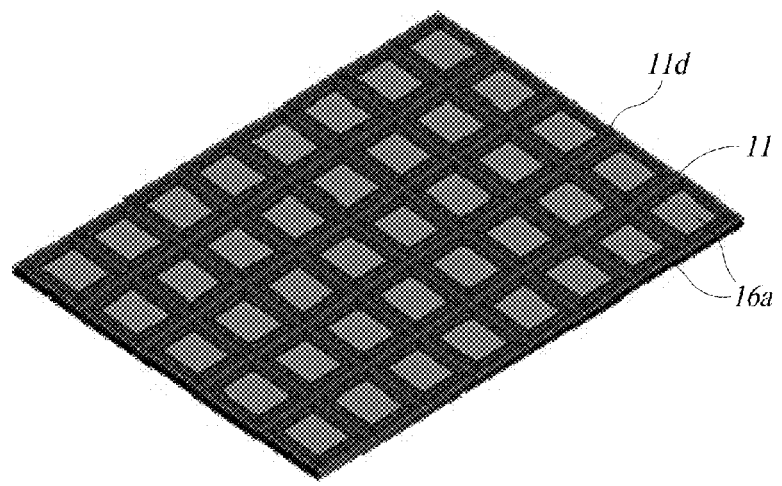
FIGS. 16A and 16B show a further perspective view and an enlarged perspective view of a plurality of devices in a second step of the manufacturing process described herein.
Figure 16B:
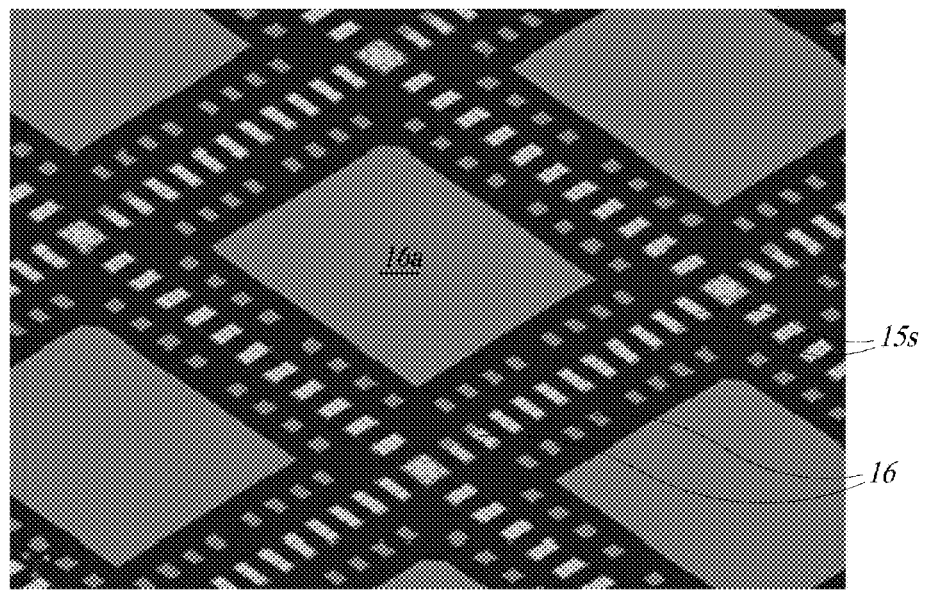
Figure 17:
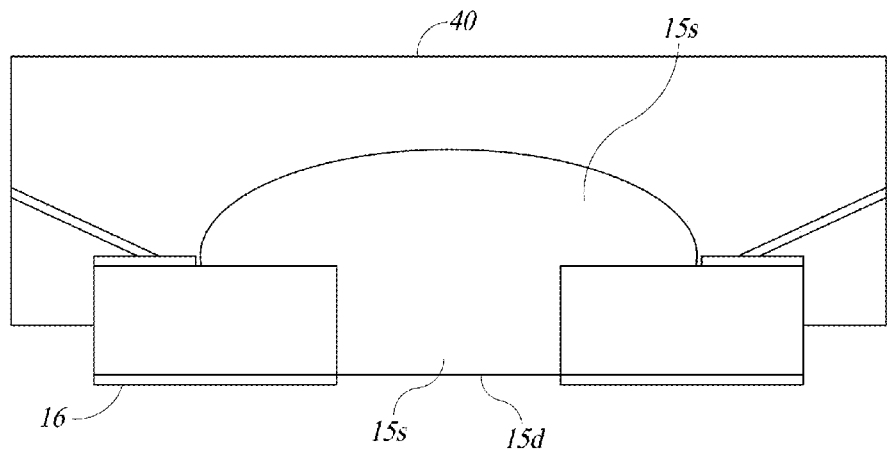

In this step, of chemical back etching, a chemical etch of the bottom surface 11d of the leadframe 11 is carried out to remove the layer of copper where it is not protected by the plating 14, namely on the contacts 16 and on the pad 16a of the bottom surface 11d. In particular, the back-etching step 180 removes the copper of the leadframe 11, but does not remove the SnCu inter-metal composite that is obtained by sintering of the TPLS and of which the sintered soldered bead 15s is made. Consequently, the soldered bead 15s, after step 180, gives out, with a bottom surface 15d of its own onto the bottom surface 11d of the leadframe 11, set in the non-masked part between the plated contacts 16, where the copper has been removed. The chemical etch 180 hence exposes also the bottom surface 15d of the soldered bead 15s for a length E of 700 μm and a width of 250 μm. FIGS. 16A and 16B are perspective views of the leadframe 11, similar to the views of FIGS. 9A and 9B following upon the step 120 of deposition, where there may be noted the leadframe 11 from the side the bottom surface 11d after the back-etching step 180, and hence the bottom surfaces 15d of the soldered beads 15s. Once again in the same context, FIG. 17 shows a detail of the contact 15 after the back-etching step 180.

Figure 5:
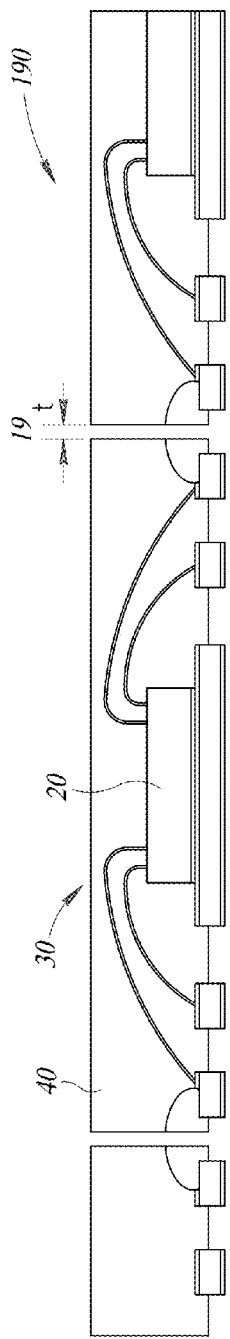
FIG. 5 is a schematic illustration of a further step of the process described herein.

The next step, step 190, of the process is illustrated in FIG. 5 and consists of a singulation of the individual device module 30, carried out preferably by cutting using diamond blades, which produces cuts 19 having a width t of approximately 200±50 μm. The device area AD comprised substantially between the separation regions 23 is separated from the other corresponding device areas, thus enabling separation of the die of the device 20 from the other dice of the other devices. The dielectric layer 40 thus cut represents, integrated with the portion of leadframe 11 corresponding to the device area AD, the package 41 of the device module 30.

Figure 18:
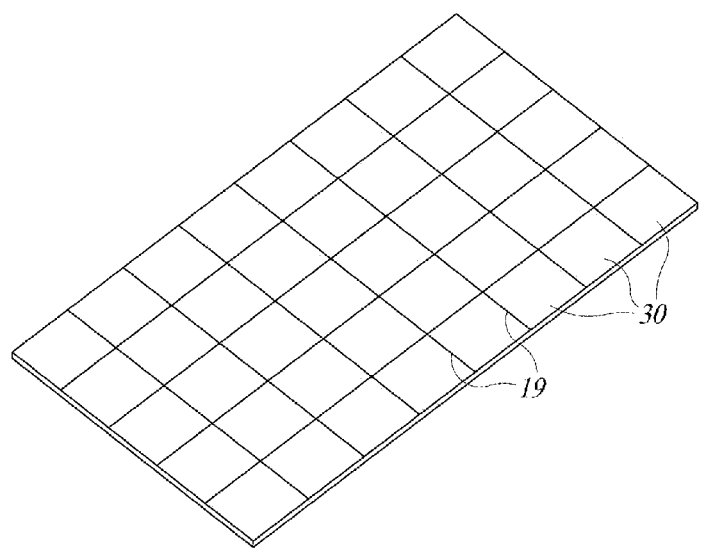
FIG. 18 shows a further view of the plurality of devices in a fifth step of the manufacturing process described herein.

FIG. 18 is a perspective view of the leadframe 11, which, after the singulation step 190, is divided into a plurality of device modules 30 by the cuts 19.

Figure 6:
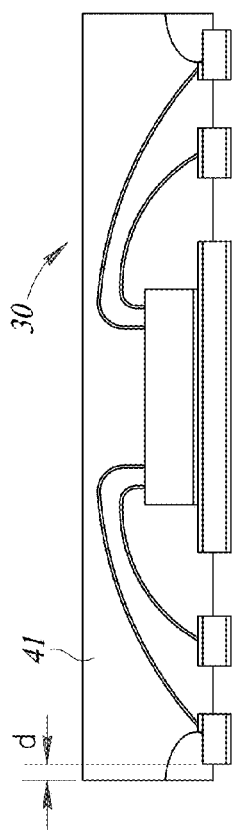
FIG. 6 shows a device module obtained in the step of FIG. 5.

FIG. 6 is illustrated just the individual module 30 in the package 41, and it may be noted how, given that the bottom surface of the package 41 substantially corresponds to the bottom surface 11d of the leadframe 11, the cut 19 determines a lateral surface 15a, which is exposed, i.e., not covered by the dielectric layer 40 or by any plating, of the soldered bead 15s of the module 30. From FIG. 6 is may also be appreciated that the bottom surface 15d, after cutting, remains exposed for a distance d of 200±50 μm.

To sum up, following upon the cutting operation 190, the dielectric region 40 forms the package 41 that covers the device 20, this package 41 being delimited underneath by the portion of leadframe 11 of the area of the device 20. The cutting operation 190 causes each soldered bead 15s, after it has in turn been cut substantially in half thus forming a cut soldered bead 15m, identifies a terminal 50 of sintered material, which comprises a bottom surface 15d, which gives out onto the bottom surface 11d of the package 41, and a lateral surface 15a, which is in turn exposed outwards and hence be solderable. This lateral surface 15a is coplanar with the lateral surface of the package P, which has a substantially parallelepipedal shape with top and bottom surfaces corresponding to those of the device area AD. Extending along the edge formed by the lateral surface 411 of the package 41 and by the bottom surface 11d are at least part of the contact terminals 50. Hence, the cutting operations (step 190) bring about formation of a device with a package of a quad-flat no-leads (QFN) type.

Hence, as has just been discussed, basically, after the singulation step 190, the soldered bead 15s has the lateral surface 15a and the bottom surface 15d exposed. This makes it possible, during a step 200 of soldering on the PCB 60 (illustrated in FIG. 7), to carry out soldering with formation of a lateral soldering meniscus 25. As may be noted in FIG. 7, a solder-paste bead 24 is laid on the PCB 60, in this embodiment preferably in the position in which a given terminal 50 is to be connected via soldering to the PCB 60 and the edge formed by the lateral surface 15a and the bottom surface 15d (which is aligned to the bottom edge of the package P) is rested on the aforesaid solder-paste bead 24, thus causing formation of the lateral meniscus 25.

Figure 19:
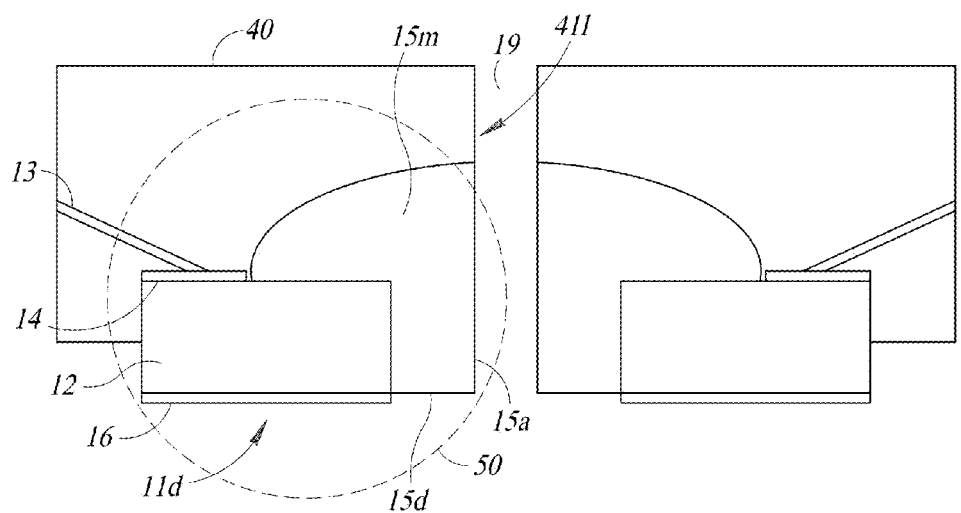

Illustrated in FIG. 19 is the detail of a cut soldered bead 15m, i.e., the soldered bead 15s divided into two by the cut 19, and also in this embodiment it may be noted how the cut 19 leads to the exposed surfaces 15a. The cut bead 15m is soldered to the area 12 and thus in electrical contact with the body of the device 20 and hence forms a contact terminal 50 on which, in particular on the lateral surface 15*a*, further contacts can be soldered. Consequently, a device is obtained, which comprises a body of semiconductor material 20, 20' and a leadframe element 11, which includes a plurality of contact terminals 50 electrically connected to the semiconductor device 20, the leadframe element 11 comprising a pad 12*a* and one or more rows R1, R2 of wire-bonding contacting areas 12, the contact terminals 50 being electrically connected to the wire-bonding contacting areas 12.

Figure 7:
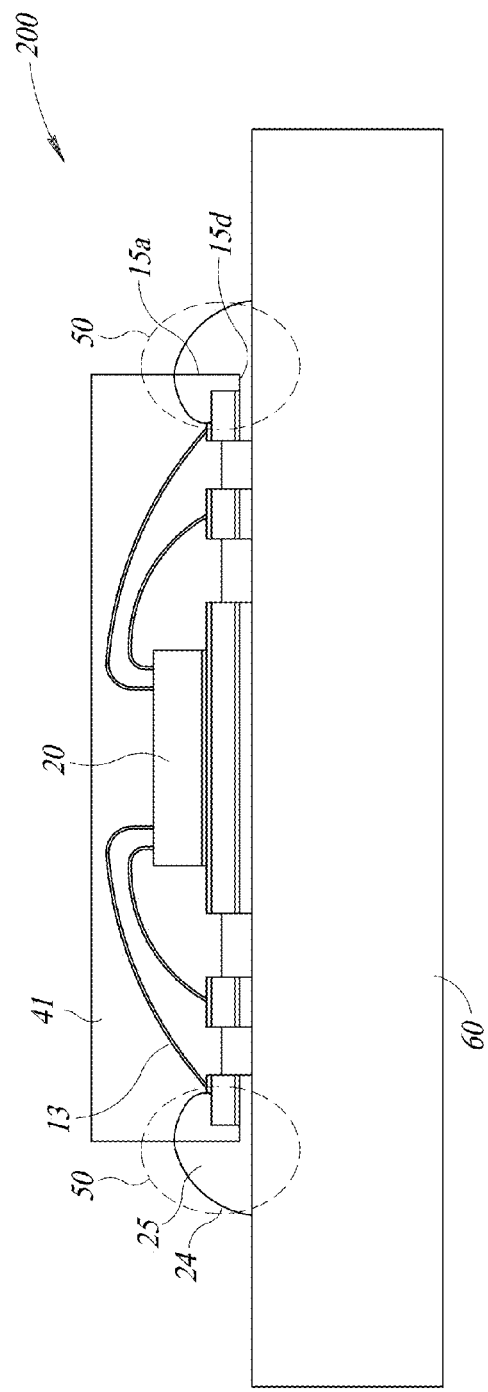
FIG. 7 shows a cross-sectional view representing a final step of the process described herein.
Figure 20:
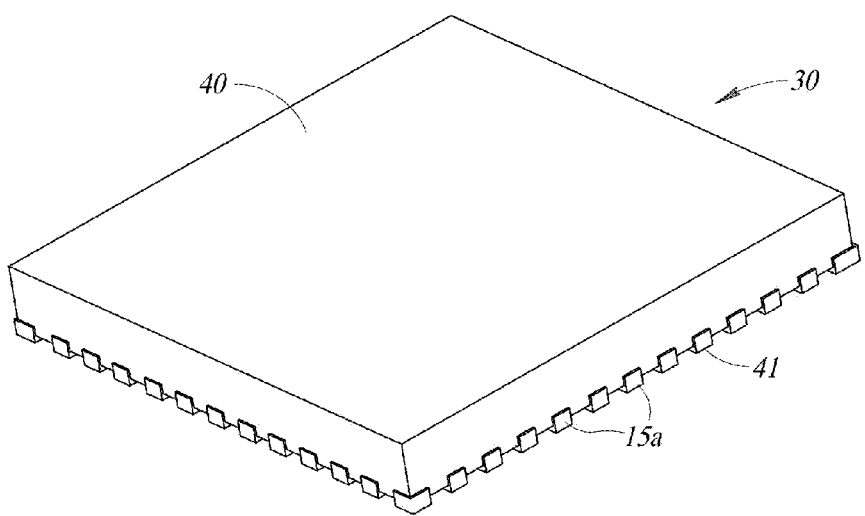
FIG. 20 shows a view of a device in a sixth step of the manufacturing process described herein.

FIG. 20 is a schematic perspective view of the module 30, which highlights the top surface coated with the dielectric layer 40 of epoxy resin, and, on the perimeter, the lateral surfaces 15*a* of the terminal 50 that emerge from the dielectric layer 40 of epoxy resin, thus providing points where soldering 200 can be carried out, as illustrated in FIG. 7.

Figure 21:
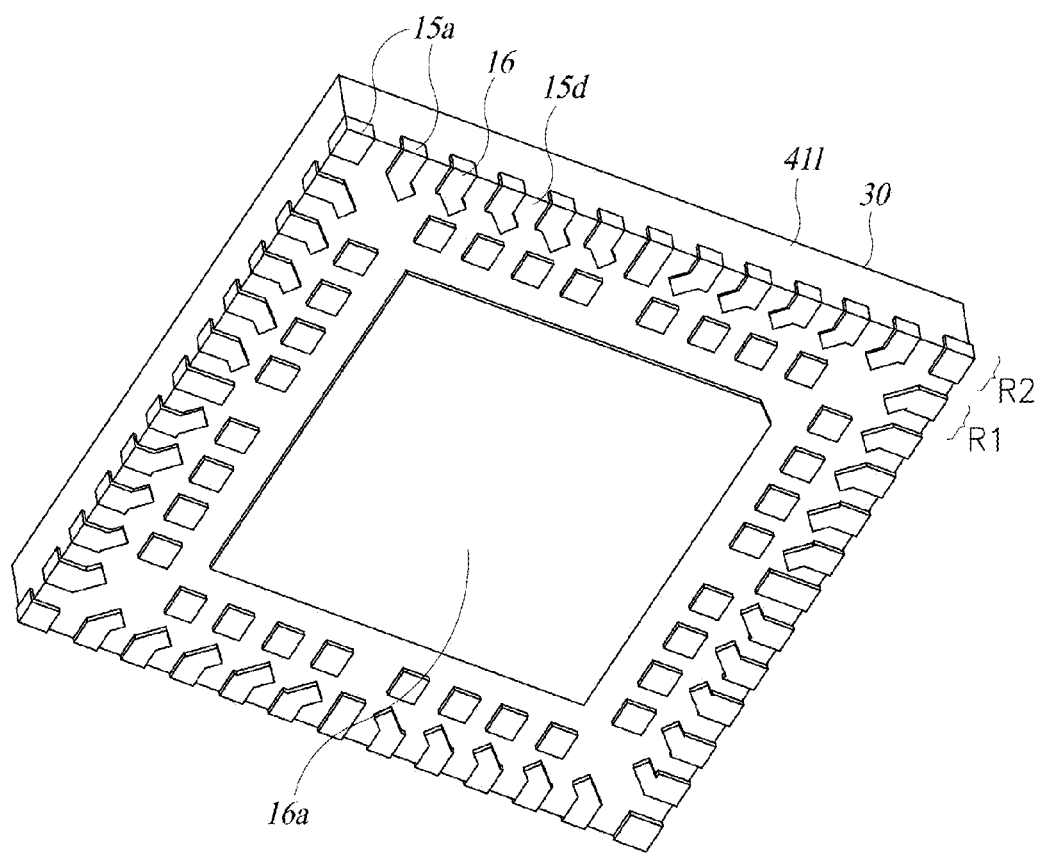
FIG. 21 shows a view of a device in a seventh step of the manufacturing process described herein.

FIG. 21 is a schematic perspective view of the device module 30, which highlights its bottom surface, and consequently both the lateral surfaces 15*a*, connected to the contacts 16 of the second row R2, along the perimeter, and the contacts 16 of the first row R1 and the bottom pad 16*a* are visible. Also visible are the bottom surfaces 15*d* of the cut bead 15*m*, which are in electrical continuity with the bottom contacts 16 and the lateral surfaces of the bead 15*m*.

Hence, the advantages of the solution disclosed emerge clearly from the foregoing description.

Advantageously, the process described enables, for a QFN_mr package, a lateral meniscus to be obtained, which is visible in a PCB inspection of the outer row, this being a characteristic that is specified in systems for automatic positioning of components.

Furthermore, advantageously, the process can use a simple mixed technology of etched leadframe and conductor screen printing. No plating line is necessary.

The process described advantageously provides that the sinterable material is applied directly on the copper leadframe, not requiring removable insulating means, or more in general temporary substrates. For this reason, the sintered material can be replaced by a high-temperature (up to 300° C.) solder paste in so far as the process, by using a metal leadframe, can enable reflow temperatures (over 250° C.) to be reached.

The device obtained via the process advantageously does not have sintered material connected to the die, i.e., to the semiconductor body, but the sintered material is applied on the contacts of the leadframe, which in turn are wire-bonded to the die.

The process is advantageously compatible with ASE, STATS, and UTAC technologies.

Of course, without prejudice to the principle of the solution described, the details and the embodiments may vary, even significantly, with respect to what has been described herein purely by way of example, without departing from the sphere of protection.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A surface-mount semiconductor device comprising:
   a die pad;
   a semiconductor die coupled to the die pad;
   a plurality of contact terminals including leads having inner portions and outer portions;
   conductive wires having first ends coupled to the semiconductor die and second ends coupled to the inner portions of the leads;
   a molding material covering the semiconductor die and the conductive wires; and
   solder beads located on the outer portions of the leads, portions of the solder beads being embedded in the molding material, the solder beads being exposed at side surfaces of the device.

2. The device according to claim 1, wherein the solder beads are made of sintered solder material.

3. The device according to claim 1 further comprising a package including a dielectric layer that covers the semiconductor die, the die pad, and portions of the plurality of contact terminals.

4. The device according to claim 3, wherein the die pad and the contact terminals extend from a bottom surface of the package, and wherein the contact terminals extend on a lateral surface of the package.

5. The device according to claim 1, wherein portions of the molding material are spaced from the outer portions of the leads by the solder material.

6. The device according to claim 1, wherein one of the second ends of the conductive wires and one of the solder beads are on the same surface of one of the leads.

7. A semiconductor package comprising:
   a leadframe including a die pad and a plurality of leads;
   a semiconductor die coupled to the die pad;
   molding material encapsulating the semiconductor die;
   spaces between upper surfaces of the plurality of leads and inner surfaces of the molding material; and
   a conductive solder material located on first portions of the plurality of leads and in the spaces, the conductive solder material being exposed at the side surfaces of package.

8. The package according to claim 7, wherein the exposed surface of the conductive solder material is coplanar with an exposed outer surface of the molding material.

9. The package according to claim 7, wherein second portions of the plurality of leads include one or more conductive layers and the first portions of the plurality of leads are leadframe material.

10. The package according to claim 9, wherein the semiconductor die is electrically coupled to the second portions of the plurality of leads by conductive wires, the conductive wires having first ends coupled to bond pads of the semiconductor die and second ends coupled to the second portions of the plurality of leads.

11. The package according to claim 9, wherein the conductive solder material is located on the first portions of the leads.

12. The package according to claim 7, wherein the plurality of leads are recessed inward from an outer edge of the molding material and the conductive solder material extends to an exposed outer edge of the molding material.

13. The package according to claim 7, wherein the plurality of leads are a first set of plurality of leads, the package further comprising a second set of plurality of leads located between the first set of plurality of leads and the die pad.

14. The package according to claim 7, wherein the conductive solder material and the molding material form coplanar outer surfaces of the package.

15. The package according to claim 7, wherein the package is coupled to a board by conductive bumps between the plurality of leads and lands of the board, wherein the conductive bumps have portions that extends along surfaces of the conductive solder material on the first portions of the leads.

16. A semiconductor package comprising:
- a leadframe including a die pad and a plurality of leads;
- a semiconductor die coupled to the die pad;
- conductive solder material located on first surfaces of the plurality of leads;
- conductive layers on the first surfaces of the plurality of leads, the conductive layers covering first portions of the first surfaces and leaving second portions of the first surfaces exposed, the conductive solder material contacting the second portions of the first surfaces, and
- molding material covering the semiconductor die, the conductive solder material, and the plurality of leads, wherein portions of the molding material are spaced from the first surfaces of the plurality of leads by the conductive solder material, and surfaces of the conductive solder material and second surfaces of the plurality of leads are exposed from the molding material.

17. The semiconductor package according to claim 16, wherein the exposed surface of the conductive solder material is coplanar with a surface of the molding material.

18. The semiconductor package according to claim 16, wherein the second surfaces of the plurality of leads extend below a bottom surface of the molding material and are set inward of a side surface of the molding material.

19. The semiconductor package according to claim 16, wherein conductive solder material is sintered solder material.

20. The device according to claim 16, further comprising conductive wires having first ends coupled to the semiconductor die and second ends coupled to the conductive layers.

* * * * *